US012804946B2

(12) United States Patent
Yang

(10) Patent No.: US 12,804,946 B2
(45) Date of Patent: Nov. 17, 2026

(54) RADIO FREQUENCY DEVICE

(71) Applicant: UNITED MICROELECTRONICS CORP., Hsin-Chu City (TW)

(72) Inventor: Po-Yu Yang, Hsinchu City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 504 days.

(21) Appl. No.: 18/215,839

(22) Filed: Jun. 29, 2023

(65) Prior Publication Data

US 2024/0396220 A1 Nov. 28, 2024

(30) Foreign Application Priority Data

May 26, 2023 (TW) ................................ 112119653

(51) Int. Cl.

*H10D 30/67* (2025.01)
*H10D 30/01* (2025.01)
*H10D 30/60* (2025.01)
*H10D 30/63* (2025.01)
*H10D 30/69* (2025.01)
*H10D 62/13* (2025.01)
*H10W 44/20* (2026.01)

(52) U.S. Cl.

CPC ..... *H10D 30/6713* (2025.01); *H10D 30/0223* (2025.01); *H10D 30/601* (2025.01); *H10D 30/63* (2025.01); *H10D 30/6711* (2025.01); *H10D 30/6715* (2025.01); *H10D 30/6728* (2025.01); *H10D 30/797* (2025.01); *H10D 62/152* (2025.01); *H10D 62/153* (2025.01); *H10W 44/20* (2026.01)

(58) Field of Classification Search

CPC ... H01L 23/66; H01L 23/2223; H01L 23/665; H10D 30/601; H10D 30/63; H10D 30/6728; H10D 30/0223; H10D 62/152; H10D 30/6711; H10D 30/6713; H10D 30/6715; H10D 30/797; H10D 62/153

See application file for complete search history.

(56) References Cited

U.S. PATENT DOCUMENTS 5,160,989 A * 11/1992 Houston ............ H10D 30/6706 257/349
H1435 H * 5/1995 Cherne .............. H10D 30/6706 257/351
5,821,575 A * 10/1998 Mistry ................. H10D 64/647 257/349
5,907,177 A * 5/1999 Uda .................. H01L 21/28593 257/E21.345
6,630,376 B1 10/2003 Krishnan et al.

(Continued)

*Primary Examiner* — David A Zarneke
(74) *Attorney, Agent, or Firm* — Winston Hsu

(57) ABSTRACT

A radio-frequency (RF) device includes a gate structure extending along a first direction on a substrate, a spacer around the gate structure, a source region adjacent to one side of the gate structure, a drain region adjacent to another side of the gate structure, a first body region extending along a second direction adjacent to one side of the source region, and a first dielectric layer extending along the second direction between the first body region and the source region. Preferably, the gate structure includes a T-shape, the T-shape includes a vertical portion and a horizontal portion, and the first body region is adjacent to one side of the vertical portion.

19 Claims, 8 Drawing Sheets

(56) References Cited

U.S. PATENT DOCUMENTS

| | | | | |
|---|---|---|---|---|
| 6,642,579 | B2 * | 11/2003 | Fung | H10D 30/0323 257/E21.415 |
| 8,114,717 | B2 * | 2/2012 | Palacios | H10D 30/4755 257/E21.403 |
| 10,192,884 | B2 | 1/2019 | Willard | |
| 2020/0357886 | A1 * | 11/2020 | Shi | H10D 30/711 |

* cited by examiner

RADIO FREQUENCY DEVICE

BACKGROUND OF THE INVENTION

1. Field of the Invention

The invention relates to a semiconductor device, and more particularly, to a radio frequency (RF) device.

2. Description of the Prior Art

As technology evolves, wireless communication is an important part of human life. Various electronic devices, such as smart phones, smart wearable devices, tablets, etc., utilize wireless radio frequency (RF) systems to transmit and receive wireless signals. A low noise amplifier (LNA) and a power amplifier (PA) are necessary amplifying circuits in the wireless RF system. In order to achieve better performance (e.g., linearity), the amplifying circuit requires an appropriate bias point. A common way is to electrically connect a biasing module to the amplifying circuit, so as to utilize the biasing module for providing a bias point for the amplifying circuit.

Nevertheless, current RF devices typically have shortcomings including higher resistance and larger parasitic capacitance, which often affects the performance of the device significantly. Hence, how to improve current RF structure for resolving this issue has become an important task in this field.

SUMMARY OF THE INVENTION

According to an embodiment of the present invention, a radio-frequency (RF) device includes a gate structure extending along a first direction on a substrate, a spacer around the gate structure, a source region adjacent to one side of the gate structure, a drain region adjacent to another side of the gate structure, a first body region extending along a second direction adjacent to one side of the source region, and a first dielectric layer extending along the second direction between the first body region and the source region. Preferably, the gate structure includes a T-shape, the T-shape includes a vertical portion and a horizontal portion, and the first body region is adjacent to one side of the vertical portion.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
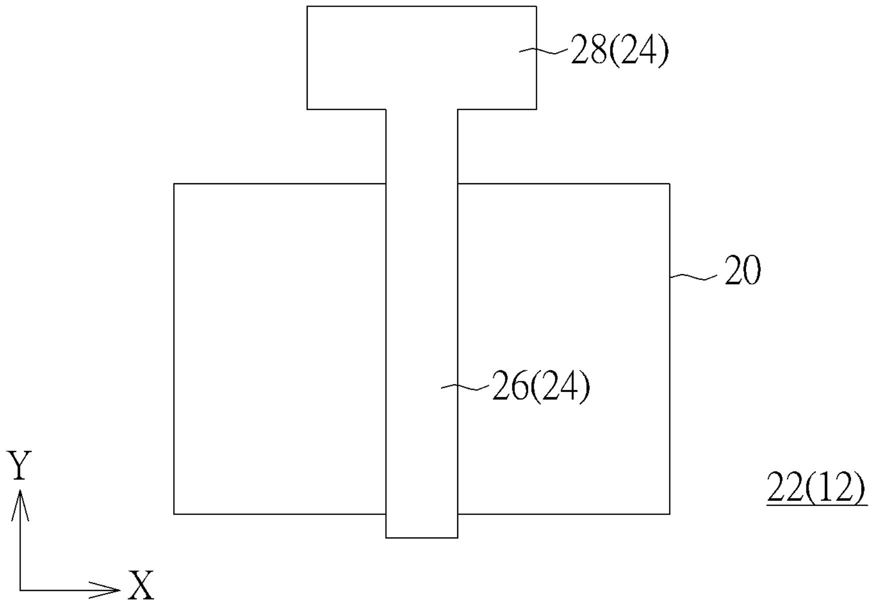
FIGS. 1-9 illustrate a method for fabricating a RF device according to an embodiment of the present invention.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on." "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

Figure 4:
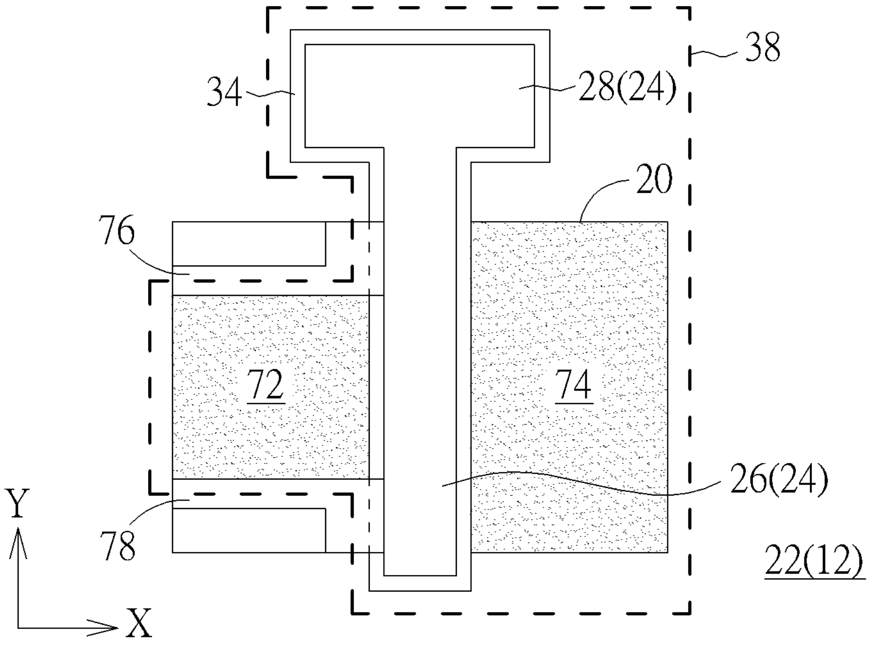
Figure 5:
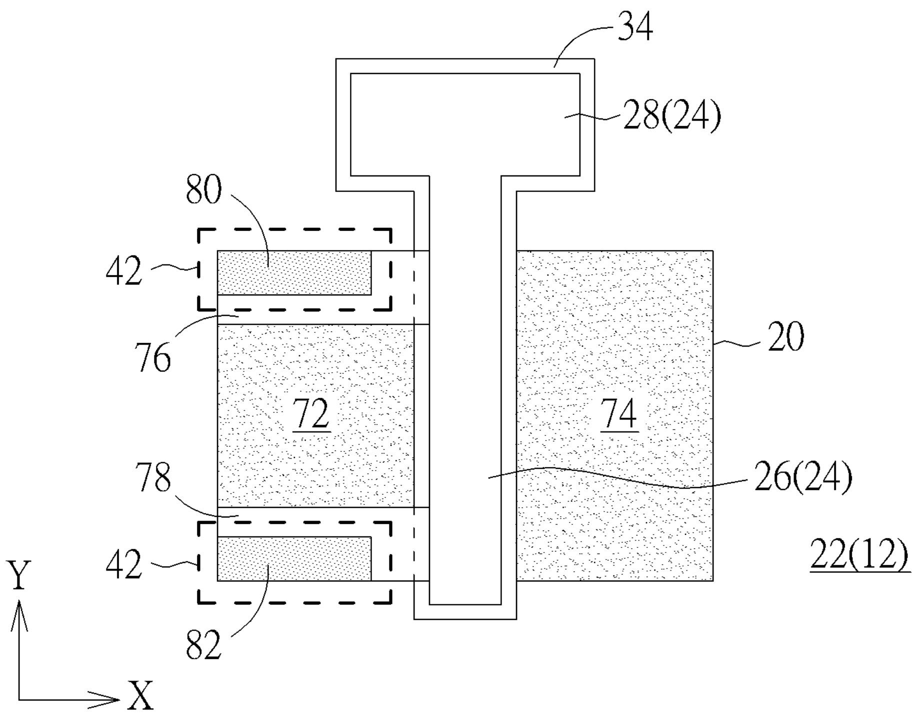
Figure 6:
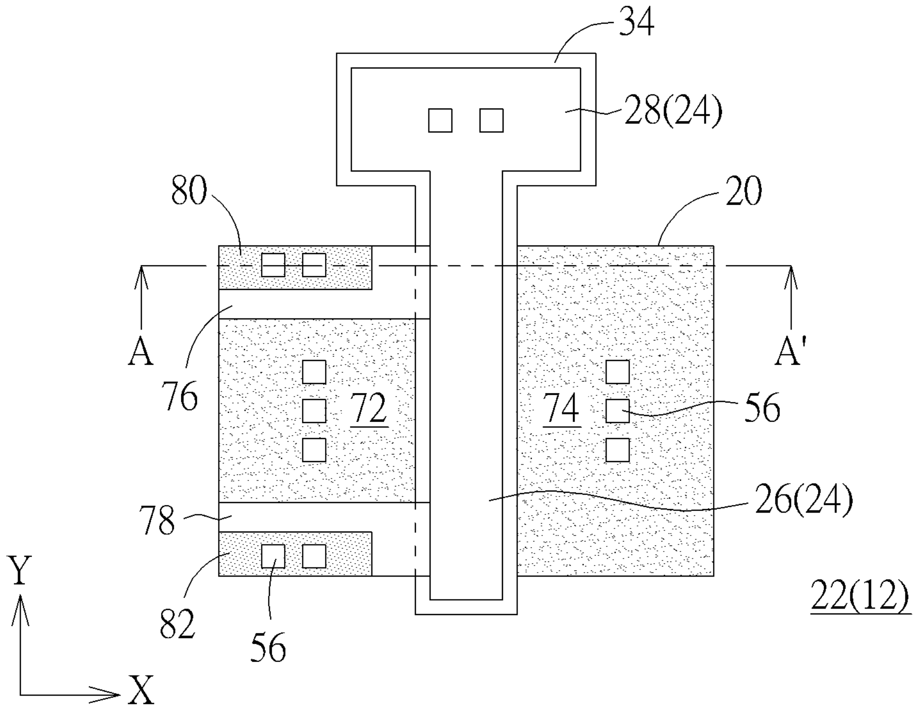
Figure 7:
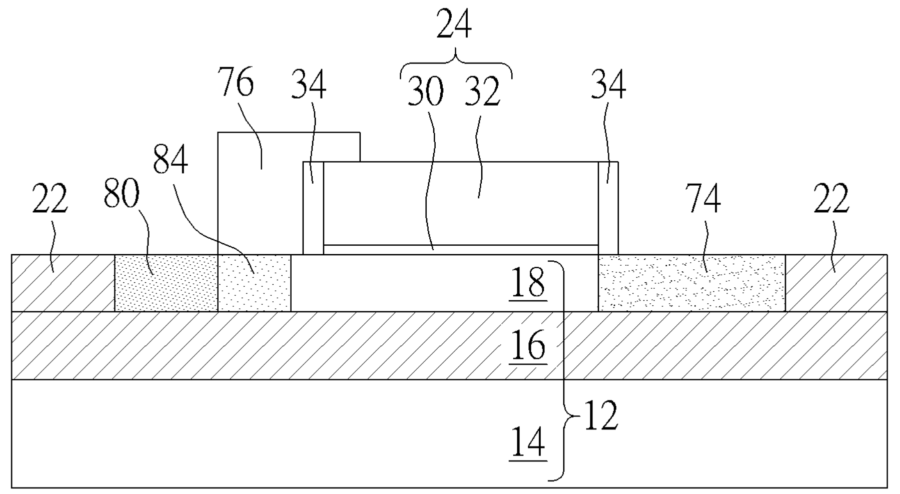
Figure 8:
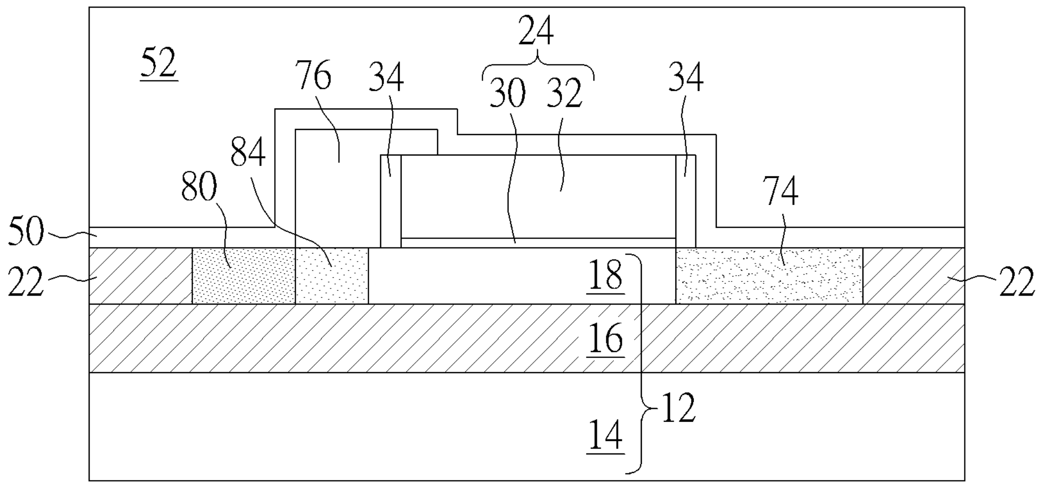
Figure 9:
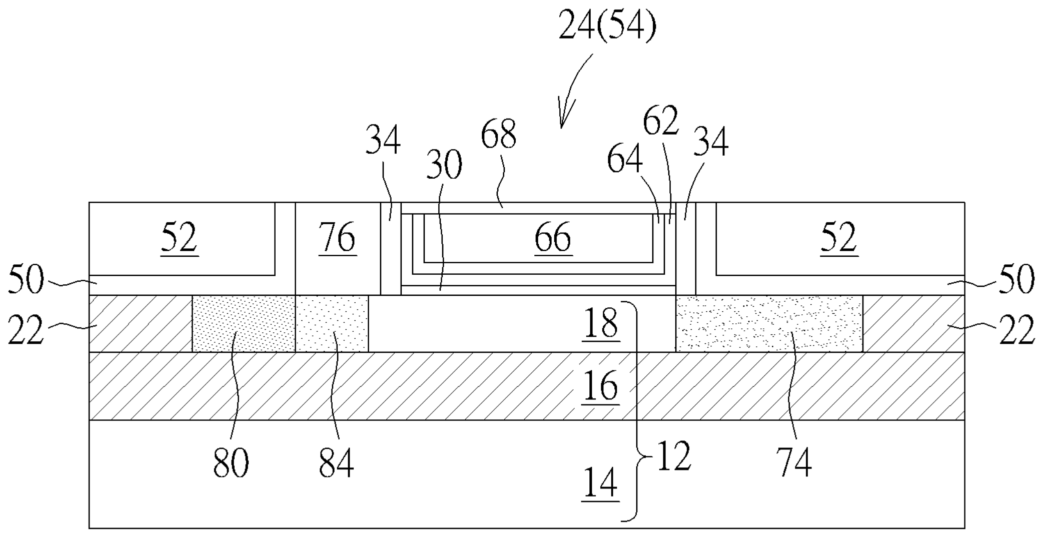

Referring to FIGS. 1-9, FIGS. 1-9 illustrate a method for fabricating a RF device according to an embodiment of the present invention, in which FIGS. 1-6 are top views for fabricating the RF device according to an embodiment of the present invention and FIGS. 7-9 are cross-section views for fabricating the semiconductor device following FIG. 6. A shown in FIGS. 1 and 7, a substrate 12 made of silicon material such as a silicon-on-insulator (SOI) substrate is provided, in which the substrate 12 includes a first semiconductor layer 14, an insulating layer 16 disposed on the first semiconductor layer 14, and a second semiconductor layer 18 disposed on the insulating layer 16. In this embodiment, the first semiconductor layer 14 and the second semiconductor layer 18 could be made of same material or different material and could both be made of material including but not limited to for example silicon, germanium, or silicon germanium (SiGe). The insulating layer 16 disposed between the first semiconductor layer 14 and second semiconductor layer 18 preferably includes $SiO_2$, but not limited thereto.

It should be noted that the substrate 12 in this embodiment pertains to be a SOI substrate, according to other embodiment of the present invention, the substrate 12 could also be a semiconductor substrate made of a silicon substrate, an epitaxial silicon substrate, or a silicon carbide (SiC) substrate, which are all within the scope of the present invention. Next, an active are 20 is defined on the substrate 12, and then part of the second semiconductor layer 18 outside the active area 20 is removed to form a shallow trench isolation (STI) 22 around the active area 20 or the remaining second semiconductor layer 18, in which an active device or TF device is to be fabricated on the second semiconductor layer 18 surrounded by the STI 22 in the later process.

Next, a gate structure 24 is formed on the substrate 12. From a top view perspective, the gate structure 24 is extending along a first direction such as Y-direction on the substrate 12, in which the gate structure 24 overall includes a T-shape, the T-shape further includes a vertical portion 26 and a horizontal portion 28, the vertical portion 26 is extending along the Y-direction on the STI 22 and the active area 20, and the horizontal portion 28 is extending along the X-direction on the STI 22 outside the active area 20.

From a cross-section perspective shown in FIG. 7, the formation of the gate structure 24 could be accomplished by a gate first process, a high-k first approach from gate last process, or a high-k last approach from gate last process. Since this embodiment pertains to a high-k last approach, a gate dielectric layer 30 or interfacial layer made of silicon oxide, a gate material layer 32 preferably made of polysilicon, and a selective hard mask (not shown) could be formed sequentially on the substrate 12, and a pattern transfer process is then conducted by using a patterned resist (not shown) as mask to remove part of the gate material layer 32 and part of the gate dielectric layer 30 through single or multiple etching processes. After stripping the patterned resist, a gate structure 24 composed of a patterned gate dielectric layer 30 and patterned gate material layer 32 is formed on the substrate 12.

Figure 2:
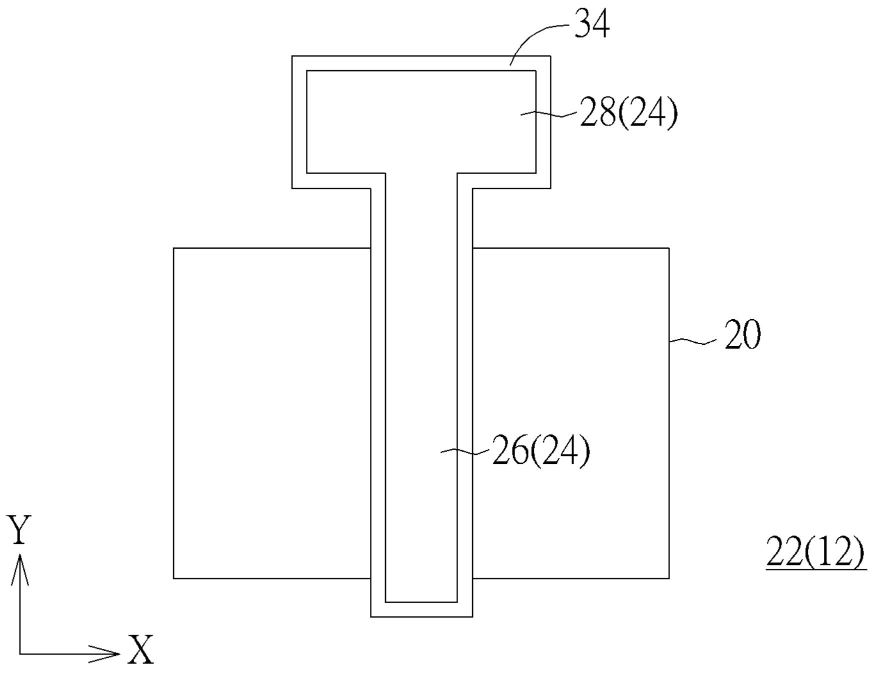

Next, as shown in FIG. 2, at least a spacer 34 is formed on sidewalls of the gate structure 24. In this embodiment, the spacer 34 could be a single spacer or a composite spacer as the spacer 34 could further include an offset spacer (not shown) and a main spacer (not shown). The offset spacer and the main spacer are preferably made of different materials while the offset spacer and main spacer could all be selected from the group consisting of $SiO_2$, SiN, SiON, and SiCN, but not limited thereto.

Figure 3:
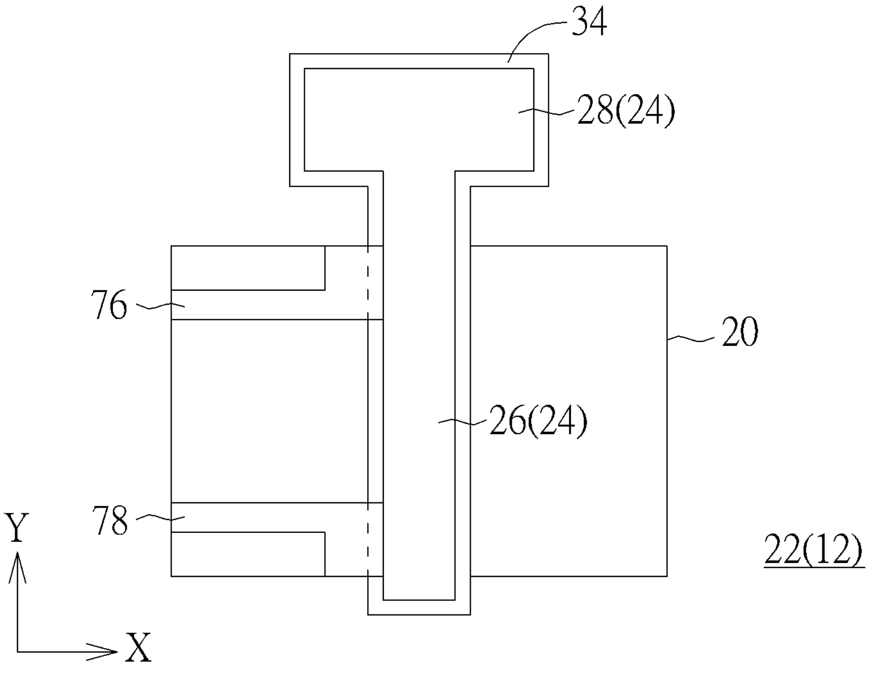

Next, as shown in FIG. 3, two dielectric layers 76 and 78 are formed extending along the X-direction adjacent to one side of the active area 20, in which the dielectric layers 76, 78 are mirror-image structures disposed on left top and left bottom of the active area 20 and each of the dielectric layers 76, 78 includes a L-shape under a top view perspective. In this embodiment, the dielectric layers 76, 78 could be made of dielectric material such as silicon oxide or silicon nitride, but not limited thereto.

Next, as shown in FIG. 4, a patterned mask (not shown) such as a patterned resist is formed to cover part of the dielectric layers 76, 78 and the substrate 12 adjacent to the dielectric layers 76, 78, and then an ion implantation process is conducted to form a doped region serving as a source region 72 and a drain region 74 in the region 38 or the substrate 12 adjacent to two sides of the vertical portion 26 of the gate structure 24. The patterned mask is then removed thereafter. In this embodiment, the ion implantation process conducted at this stage preferably implants n-type dopants into the substrate 12 so that the source region 72 and the drain region 74 formed are n+ regions. Moreover, since the dielectric layers 76, 78 are formed closer to the upper and lower edges of the source region 72, the overall area of the source region 72 is slightly less than the area of the drain region 74.

Next, as shown in FIG. 5, another patterned mask (not shown) such as a patterned resist is formed to cover the source region 72 and drain region 74, and then an ion implantation process is conducted to form another doped region or doped regions serving as body regions 80, 82 in the region 42 or the substrate 12 adjacent to the dielectric layers 76, 78. In this embodiment, the ion implantation process conducted at this stage preferably implants p-type dopants into the substrate 12 so that the body regions 80, 82 are preferably p+ regions.

Referring to FIGS. 6-9, FIG. 6 illustrates a top view for fabricating a RF device following FIG. 5, FIG. 7 illustrates a cross-section view of FIG. 6 taken along the sectional line AA', and FIGS. 8-9 illustrate cross-section views for fabricating the RF device following FIG. 7. It should be noted that as shown in FIG. 7, after being implanted with p-type dopants, part of the p-type dopants within the body region 80 would diffuse toward right side of the substrate 12 to form another region 84 with slightly lower concentration of p-type dopants in the substrate 12 directly under the dielectric layer 76.

Next, as shown in FIGS. 6-9, a selective salicide process could be conducted to form a silicide on the surface of the source region 72, the drain region 74, and the body regions 80, 82, a contact etch stop layer (CESL) 50 and an inter-layer dielectric (ILD) layer 52 could be formed around the gate structure 24 as shown in FIG. 8, a replacement metal gate (RMG) process could be conducted to transform the gate structure 24 into metal gate 54 as shown in FIG. 9, and then finally a contact plug formation could be conducted to form contact plugs 56 in the ILD layer 52 connecting the source region 72, the drain region 74, and the body regions 80, 82 as shown in FIG. 6.

Specifically, as shown in FIG. 8, a contact etch stop layer (CESL) 50 made of silicon nitride could be formed on the substrate 12 surface to cover the gate structure 24, the spacer 36, and the dielectric layer 76, and then an ILD layer 52 is formed on the CESL 50 afterwards.

Next, as shown in FIG. 9, a planarizing process such as a chemical mechanical polishing (CMP) process is conducted to remove part of the ILD layer 52, part of the CESL 50, and part of the dielectric layer 76 so that the top surfaces of the spacer 34, dielectric layer 76, CESL 50, and ILD layer 52 are coplanar.

Next, a replacement metal gate (RMG) process is conducted to transform the gate structure 24 into a metal gate 54. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 32 from gate structure 24 for forming a recess (not shown) in the ILD layer 52. Next, a high-k dielectric layer 62, a work function metal layer 64, and a low resistance metal layer 66 are formed in the recess, and a planarizing process such as CMP is conducted to remove part of low resistance metal layer 66, part of work function metal layer 64, and part of high-k dielectric layer 62 to form a metal gate 54. In this embodiment, the gate structure 24 or metal gate 54 fabricated through high-k last process of a gate last process preferably includes an interfacial layer or gate dielectric layer 30, a U-shaped high-k dielectric layer 62, a U-shaped work function metal layer 64, and a low resistance metal layer 66 as the high-k dielectric layer 62, the work function metal layer 64, and the low resistance metal layer 66 together serving as a gate electrode for each transistor or each device.

In this embodiment, the high-k dielectric layer 62 is preferably selected from dielectric materials having dielectric constant (k value) larger than 4. For instance, the high-k dielectric layer 50 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 64 is formed for tuning the work function of the metal gate in accordance with the conductivity of the device. For an NMOS transistor, the work function metal layer 64 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 64 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 64 and the low resistance metal layer 66, in which the material of the barrier layer may include titanium (Ti), titanium nitride (TiN), tantalum (Ta) or tantalum nitride (TaN). Furthermore, the material of the low-resistance metal layer 66 may include copper (Cu), aluminum (Al), titanium aluminum (TiAl), cobalt tungsten phosphide (CoWP) or any combination thereof.

Next, part of the high-k dielectric layer 62, part of the work function metal layer 64, and part of the low resistance metal layer 66 are removed to form a recess (not shown), and a hard mask 68 is then formed into the recess so that the top surfaces of the hard mask 68 and ILD layer 52 are coplanar. The hard mask 68 could be made of material including but not limited to for example $SiO_2$, SiN, SION, SiCN, or combination thereof.

According to an embodiment of the present invention, the formation of the contact plugs 56 could be accomplished by first conducting a photo-etching process by using a patterned mask (not shown) as mask to remove part of the ILD layer 52 and part of the CESL 50 adjacent to the gate structure 24 for forming contact holes (not shown) exposing the source/drain region 40 and body region 44. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned barrier layer and low resistance metal layer for forming contact plugs 56 electrically connecting the source region 72, the drain region 74, and the body regions 80, 82. This completes the fabrication of a semiconductor device according to an embodiment of the present invention.

Referring to FIG. 9, FIG. 9 illustrates a structural view of a RF device according to an embodiment of the present invention. As shown in FIG. 9, the RF device includes a gate structure 24 disposed on the substrate 12, a spacer 34 adjacent to one side such as left side of the gate structure 24, a spacer 34 disposed on another side such as right side of the gate structure 24, a CESL 50 disposed adjacent to the left spacer 34, a CESL 50 disposed adjacent to the right spacer 34, a dielectric layer 76 disposed adjacent to one side such as left side of the gate structure 24, a body region 80 disposed in the substrate 12 adjacent to the dielectric layer 76, and an ILD layer 52 around the CESL 50. Preferably, the sidewall of the body region 80 on left side of the gate structure 24 is aligned with a sidewall of the dielectric layer 76.

Specifically, the dielectric layer 76 is disposed between the left spacer 34 and the left CESL 50, no dielectric layer 76 is disposed between the right spacer 34 and the right CESL 50, hence the dielectric layer 76 is only disposed on one side of the gate structure 24. Preferably, the substrate 12 of this embodiment includes a SOI substrate so that the STI 22 is disposed in substrate 12 adjacent to two sides of the gate structure 24, in which the left and right STI 22 are both disposed under the CESL 50 and the ILD layer 52.

Figure 10:
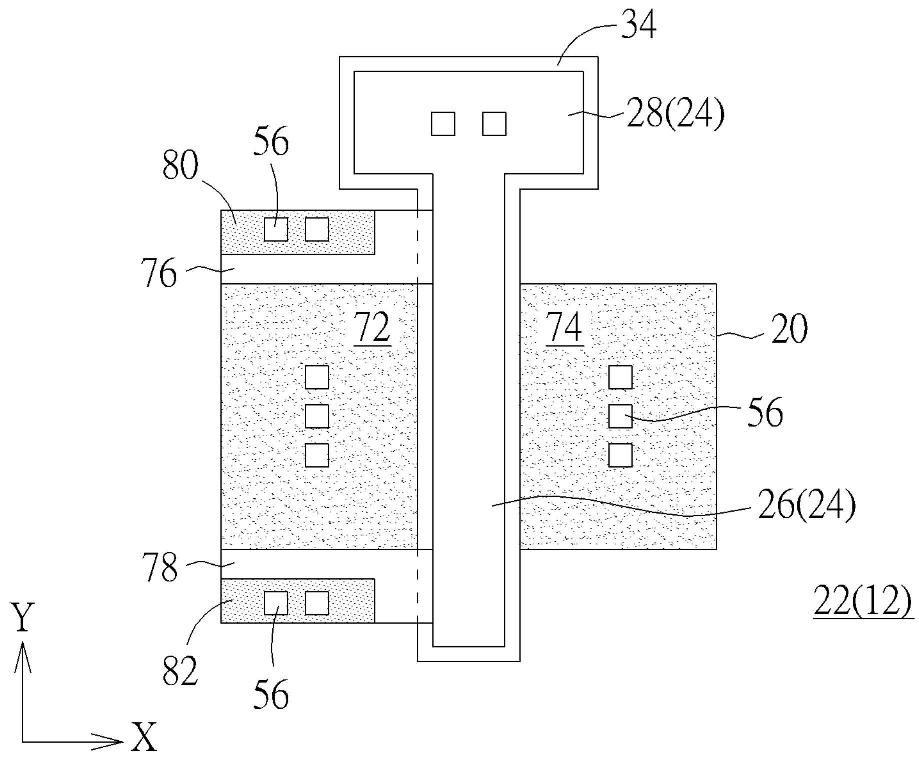
FIG. 10 illustrates a top view of a RF device according to an embodiment of the present invention.

Referring to FIG. 10, FIG. 10 illustrates a top view of a RF device according to an embodiment of the present invention. As shown in FIG. 10, in contrast to the source region 72 and drain region 74 shown in FIG. 6 are asymmetrical or the area of the source region 72 is less than the area of the drain region 74, the source region 72 and drain region 74 in this embodiment are symmetrical as the source region 72 and the drain region 74 preferably have same area.

Similar to the ones shown in FIG. 6, the two dielectric layers 76, 78 and the body regions 80, 82 in this embodiment are also disposed on left side of the gate structure 24 and also adjacent to two sides of the source region 72. However, in contrast to outer sidewalls of the dielectric layers 76, 78 and body regions 80, 82 are aligned with edges of the source/drain region 72 and drain region 74 or edges of the source region 72 and drain region 74 extending along the X-direction are not aligned with each other as shown in FIG. 6, the inner sidewall of the dielectric layer 76 in this embodiment is aligned with an edge of the drain region 74 or edges of the source region 72 and drain region 74 extending along the X-direction are aligned with each other.

Figure 11:
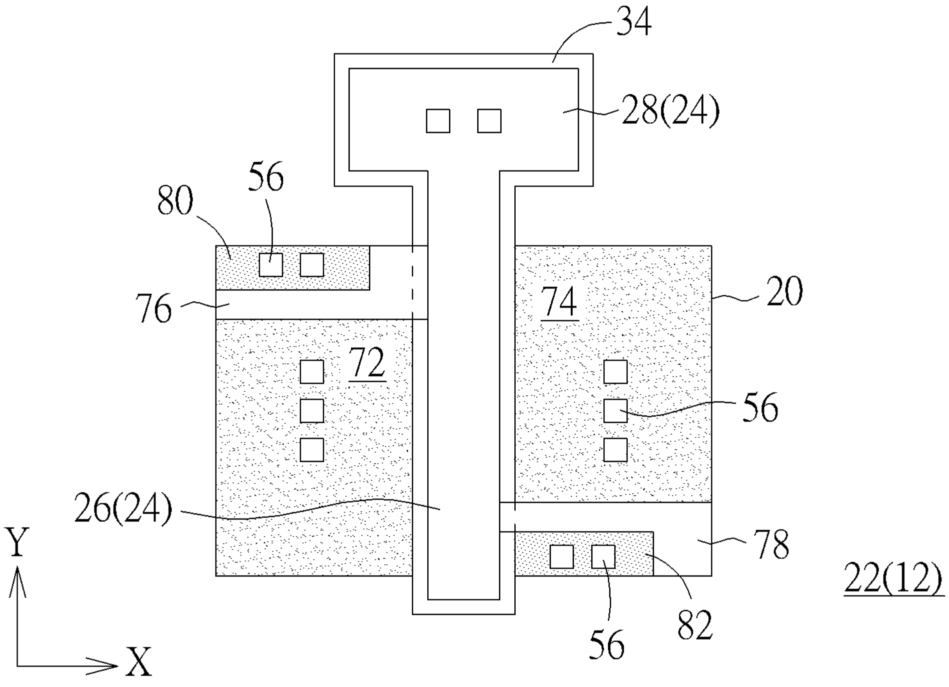
FIG. 11 illustrates a top view of a RF device according to an embodiment of the present invention.

Referring to FIG. 11, FIG. 11 illustrates a top view of a RF device according to an embodiment of the present invention. As shown in FIG. 11, in contrast to the two dielectric layers 76, 78 and the two body regions 80, 82 shown in FIG. 6 are all disposed adjacent to one side of the gate structure 24, it would also be desirable to form two sets of dielectric layers 76, 78 and body regions 80, 82 diagonally adjacent to two sides of the gate structure 24 on corners of the source region 72 and drain region 74. For instance, the dielectric layer 76 and the body region 80 in this embodiment are disposed on left side of the gate structure 24 and above the source region 72 while the dielectric layer 78 and the body region 82 are disposed on right side of the gate structure 24 and below the drain region 74. In the meantime, outer sidewalls of the dielectric layer 76 and the body region 80 extending along the X-direction are aligned with an edge of the drain region 74 and outer sidewalls of the dielectric layer 78 and the body region 82 extending along the X-direction are aligned with an edge of the source region 72.

Figure 12:
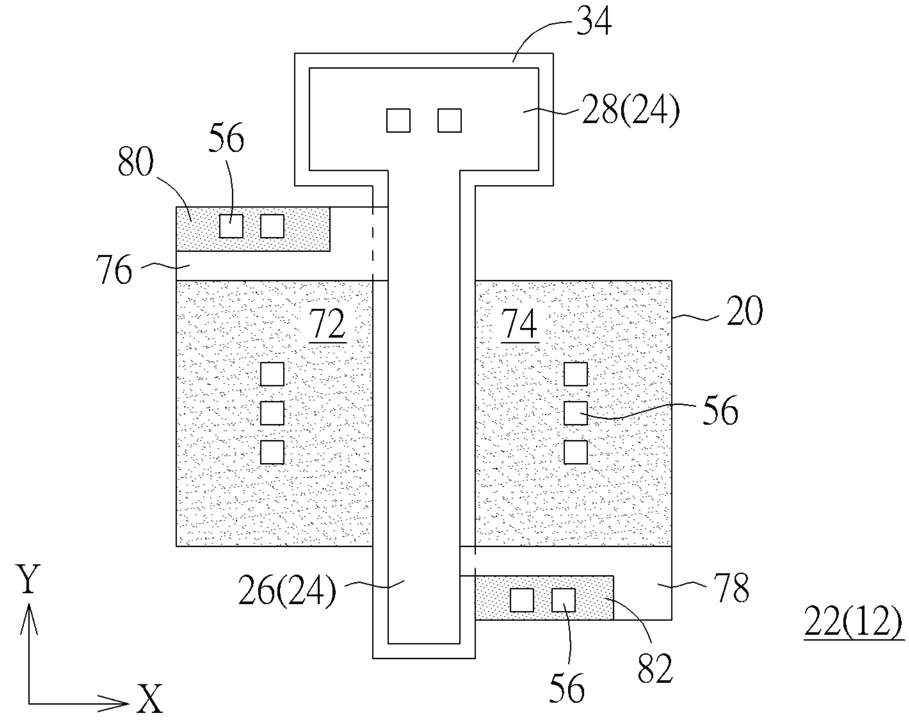
FIG. 12 illustrates a top view of a RF device according to an embodiment of the present invention.

Referring to FIG. 12, FIG. 12 illustrates a top view of a RF device according to an embodiment of the present invention. As shown in FIG. 12, two sets of dielectric layers 76, 78 and body regions 80, 82 are also formed diagonally adjacent to two sides of the gate structure 24 on corners of the source region 72 and drain region 74 as shown in FIG. 11. Nevertheless, in contrast to edges of the source region 72 extending along the X-direction not aligned with edges of the drain region 74 extending along the X-direction as disclosed in the aforementioned embodiment, the edges of the source region 72 extending along the X-direction in this embodiment are aligned with edges of the drain region 74 extending along the X-direction. In other words, in contrast to having outer sidewalls of the dielectric layers 76, 78 and body regions 80, 82 aligned with edges of the source region 72 and drain region 74 on opposite sides in previous embodiment, the inner sidewalls of the dielectric layers 76, 78 and body regions 80, 82 are aligned with edges of the source region 72 and drain region 74 on opposite sides in this embodiment.

Figure 13:
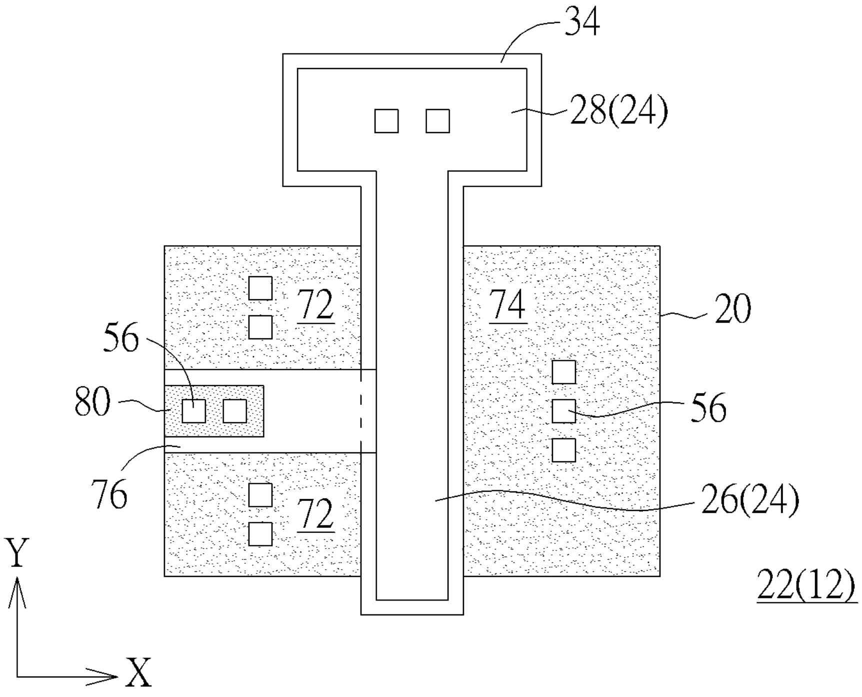
FIG. 13 illustrates a top view of a RF device according to an embodiment of the present invention.

Referring to FIG. 13, FIG. 13 illustrates a top view of a RF device according to an embodiment of the present invention. As shown in FIG. 13, in contrast to forming two sets of dielectric layers 76, 78 and body regions 80, 82 on either one side or two sides of the gate structure 24 and adjacent to the source region 72 and drain region 74 in the previous embodiments, it would also be desirable to only form one set of dielectric layer 76 and body region 80 adjacent to one side of the gate structure 24, in which the dielectric layer 76 and the body region 80 are extending along the X-direction to divide the source region 72 into two portions. In contrast to the dielectric layer 76 in the aforementioned embodiment includes a L-shape under top view perspective, the dielectric layer 76 in this embodiment includes a U-shape.

Figure 14:
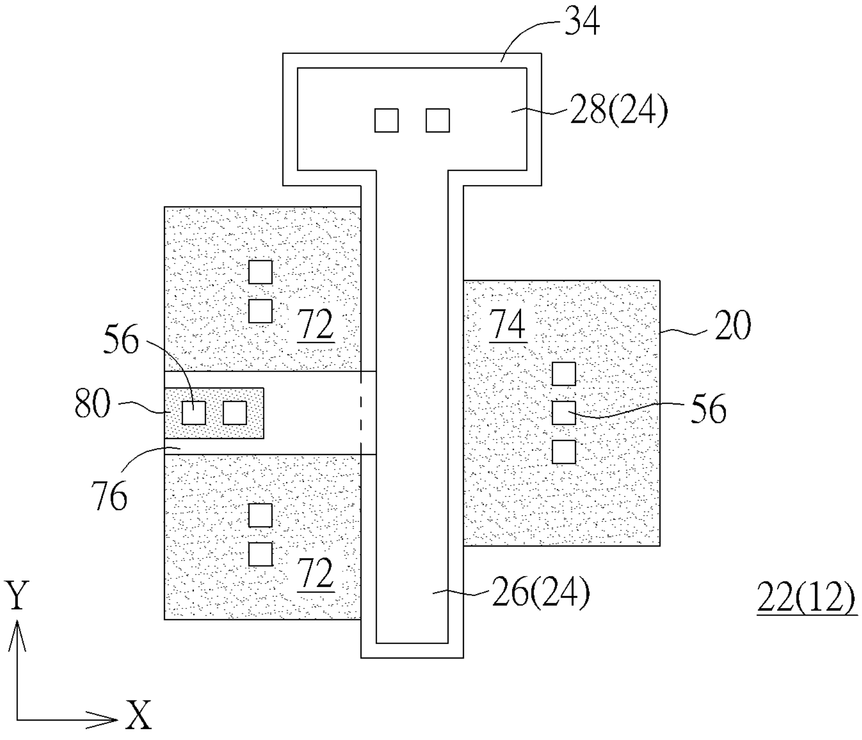
FIG. 14 illustrates a top view of a RF device according to an embodiment of the present invention.

Referring to FIG. 14, FIG. 14 illustrates a top view of a RF device according to an embodiment of the present invention. As shown in FIG. 14, it would be desirable to only form one set of dielectric layer 76 and body region 80 adjacent to the gate structure 24 as shown in FIG. 13. Nevertheless, in contrast to edges of the source regions 72 extending along the X-direction are aligned with edges of the drain region 74 on the other side as disclosed in the previous embodiment, the edges of the source regions 72 extending along the X-direction in this embodiment are not aligned with edges of the drain region 74 extending along the X-direction on the other side.

Figure 15:
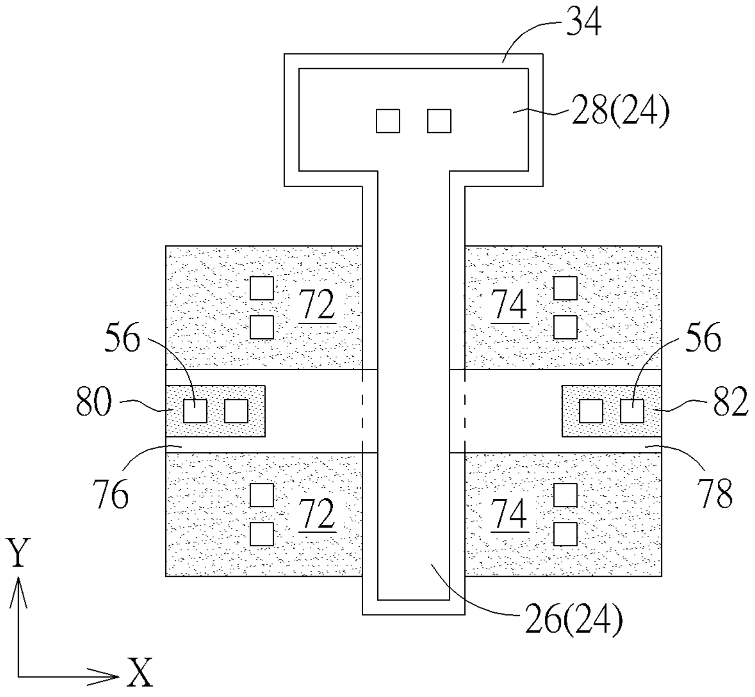
FIG. 15 illustrates a top view of a RF device according to an embodiment of the present invention.

Referring to FIG. 15, FIG. 15 illustrates a top view of a RF device according to an embodiment of the present invention. As shown in FIG. 15, in contrast to only placing one set of dielectric layer 76 and body region 80 on center of the source region 72 as shown in FIG. 13, it would be desirable to form another set of dielectric layer 78 and body region 82 on center of the drain region 74, in which the edges of the dielectric layer 76 and body region 80 extending along the X-direction are aligned with edges of the dielectric layer 78 and body region 82. In other words, the two sets of dielectric layers 76, 78 and body regions 80, 82 are preferably mirror images of each other.

Figure 16:
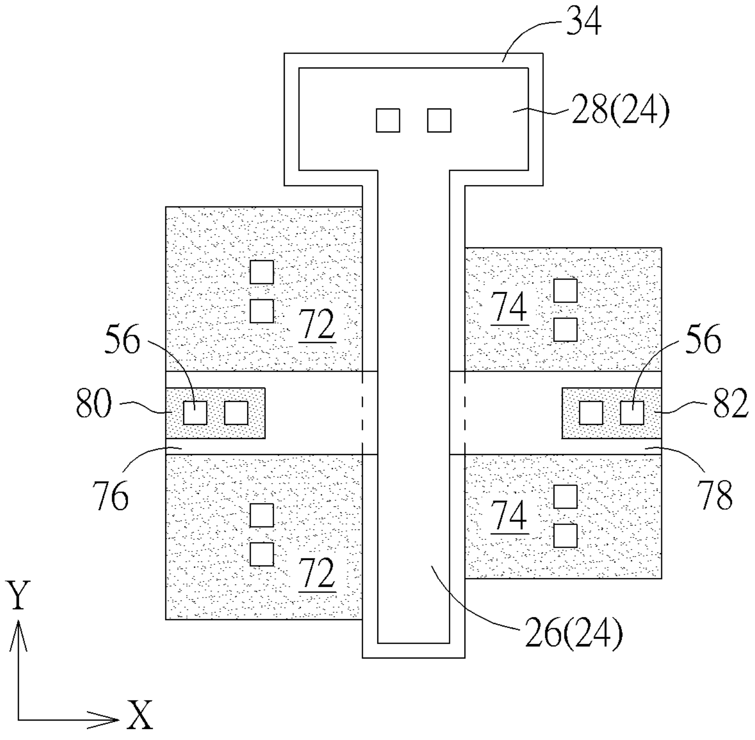
FIG. 16 illustrates a top view of a RF device according to an embodiment of the present invention.

Referring to FIG. 16, FIG. 16 illustrates a top view of a RF device according to an embodiment of the present invention. As shown in FIG. 16, it would be desirable to form a set of dielectric layer 76 and body region 80 on the center of the source region 72 and another set of dielectric layer 78 and body region 82 on the center of the drain region 74 as shown in FIG. 15. However, in contrast to the source regions 72 and the drain regions 74 have same area and aligned edges extending along the X-direction, the edges of the source regions 72 extending along the X-direction in this embodiment are not aligned with edges of the drain regions 74 while the area of each of the drain regions 74 is also less than the area of each of the source regions 72.

Overall, the present invention provides a novel RF device structure which in the top view of FIG. 6 for instance places a dielectric layer 36 between the tail end of the T-shape gate structure 24 and the body region 44. By doing so, as shown in the cross-section view of FIG. 7, the region 48 below the dielectric layer 36 would not be having any depletion region or any gate field so that electron holes directly under the gate structure could be easily expelled outside. According to a preferred embodiment of the present invention, this design not only lowers resistance and parasitic capacitance of the entire device, but also reduces floating body effects and improves overall performance of the device significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radio-frequency (RF) device, comprising:

a gate structure extending along a first direction on a substrate;

a source region adjacent to one side of the gate structure;

a drain region adjacent to another side of the gate structure;

a first body region extending along a second direction immediately adjacent to one corner of the source region away from the gate structure; and a first dielectric layer interposed between the first body region and the source region along the second direction, wherein the first dielectric layer separates the first body region from the source region.

2. The RF device of claim 1, further comprising a spacer around the gate structure.

3. The RF device of claim 1, wherein the gate structure comprises a T-shape.

4. The RF device of claim 3, wherein the T-shape comprises a vertical portion and a horizontal portion.

5. The RF device of claim 4, wherein the first body region is adjacent to one side of the vertical portion.

6. The RF device of claim 1, wherein the first body region and the source region comprise different conductive type.

7. The RF device of claim 1, wherein the first dielectric layer comprises a L-shape.

8. The RF device of claim 1, further comprising a second body region extending along the second direction adjacent to another side of the source region.

9. The RF device of claim 8, further comprising a second dielectric layer extending along the second direction between the second body region and the source region.

10. The RF device of claim 9, wherein the second dielectric layer comprises a L-shape.

11. The RF device of claim 1, wherein the source region and the drain region comprise same area.

12. The RF device of claim 1, wherein the source region and the drain region comprise different areas.

13. The RF device of claim 1, further comprising a second body region extending along the second direction adjacent to one side of the drain region.

14. The RF device of claim 13, wherein the first body region and the second body region are disposed diagonally.

15. The RF device of claim 13, further comprising a second dielectric layer extending along the second direction between the second body region and the drain region.

16. The RF device of claim 15, wherein the second dielectric layer comprises a U-shape.

17. The RF device of claim 1, wherein the first dielectric layer comprises a U-shape.

18. The RF device of claim 1, wherein the gate structure comprises a metal gate.

19. The RF device of claim 1, wherein the substrate comprises a silicon-on-insulator (SOI) substrate.

* * * * *